United States Patent [19]
Lei

[11] Patent Number: 5,955,977
[45] Date of Patent: Sep. 21, 1999

[54] SYSTEM FOR AVOIDING START CODE EMULATION AND LONG CARRY-OVER PROPAGATION

[75] Inventor: Shaw-Min Lei, Camas, Wash.

[73] Assignee: Sharp Laboratories of America, Inc., Camas, Wash.

[21] Appl. No.: 08/825,508

[22] Filed: Mar. 31, 1997

[51] Int. Cl.⁶ .................................................. H03M 7/00
[52] U.S. Cl. ............................................. 341/107; 341/94
[58] Field of Search ................................. 341/51, 63, 94, 341/107

[56] References Cited

U.S. PATENT DOCUMENTS

| | | |
|---|---|---|
| 4,122,440 | 10/1978 | Langdon, Jr. et al. . |
| 4,463,342 | 7/1984 | Langdon, Jr. et al. ................. 341/107 |
| 4,918,446 | 4/1990 | Yagi ......................................... 341/94 |
| 4,973,961 | 11/1990 | Chamzas et al. ........................ 341/51 |
| 5,023,612 | 6/1991 | Liu ........................................... 341/94 |
| 5,311,177 | 5/1994 | Kimura et al. ............................ 341/51 |
| 5,396,239 | 3/1995 | McMahon et al. ....................... 341/58 |

OTHER PUBLICATIONS

"Arithmetic Coding for Data Compression" written by Ian Witten, Radford M. Neal and John G. Cleary, *Communications of the ACM, Computing Practices,* Jun. 1987, vol. 30, No. 6, pp. 520–540.

"Video Coding for Low Bitrate Communications" written by International Telecommunication Union, ITU–T Draft H.263 dated May 2, 1996, 53 pages.

"Synchronous Data Link Control: A Perspective" written by Donnan and Kersey, IBM Systems Journal, vol. 13, No. 2, 1974, pp. 140–162.

*Primary Examiner*—Marc S. Hoff
*Attorney, Agent, or Firm*—Marger, Johnson, et al.

[57] ABSTRACT

An encoding scheme controls long carry-over propagation while at the same time prevents start code emulation. An arithmetic encoder converts an input signal into an encoded bit stream that provides data compression of the original input signal. The encoding scheme identifies carry-overs from the encoded input signal that could propagate into portions of the previously encoded bit stream and inadvertently emulate a start code. Bit stuffing is used to avoid emulation of the start code while at the same time limit propagation of carry-overs. A first bit stuffing procedure is used for detecting carry-over in the encoded input signal. A second bit stuffing procedure is used during normalization of the arithmetic encoded data.

19 Claims, 11 Drawing Sheets

Registers Used in Arithmetic Coding

| U | Unresolved Bits |
|---|---|
| 0 | None |
| 1 | 0 |
| 2 | 01 |
| 3 | 011 |
| ... | ... |
| $n$ | $\underbrace{0\,1\,1\,...\,1}_{(n-1)\text{ 1's}}$ |
| ... | ... |

The Relationship between *U* and Unresolved Bits

FIG. 6

SYSTEM FOR AVOIDING START CODE EMULATION AND LONG CARRY-OVER PROPAGATION

BACKGROUND OF THE INVENTION

This invention relates to controlling carry-over propagation and at the same time avoiding inadvertent emulation of start codes and more particularly to controlling carry-over and start code emulation in arithmetic encoded character strings.

Start codes are inserted between sections of transmitted characters for synchronizing communication equipment. A start code or synchronization code typically consists of either a long string of 1's followed by a zero or a long string of 0's followed by a 1. One solution to avoiding start code emulation comprises inserting one or more opposite bit(s) after detecting a fixed number of one's or zero's, usually one less than the string of one's or zeros's that would comprise the start code. The inserted bits are recognized and deleted before decoding the encoded data.

Techniques are known in the art for providing carry-over control in encoded signals. Prior carry-over control techniques for use in arithmetic coding and decoding, are described in U.S. Pat. No. 4,973,961 issued Nov. 27, 1990 to Chamzas et al. and U.S. Pat. No. 4,463,342 issued Jul. 31, 1984 to Langdon, Jr. et al. Other techniques for controlling carry-over in arithmetic encoded signals are described in an article entitled "ARITHMETIC CODING FOR DATA COMPRESSION", Communications of the ACM, June 1987, volume 30, Number 6, pages 520–540 and an article entitled "A Multi-Purpose VLSI Chip For Adaptive Data Compression of Bilevel Images", IBM Journal of Research Development, Vol 32, No. 6, November 1988, pages 775–795.

The carry-over control techniques disclosed in U.S. Pat. Nos. 4,973,961 and 4,463,342 and in the Communications of the ACM and IBM Journal articles, noted above, use zero bit/character stuffing to intercept carry-over and use counters to realize a long guard register. These carry-over techniques are based on the knowledge that unresolved bit strings that might be changed by a possible carry-over have a common pattern, "011 . . . 1". Thus, a counter can be used to track the length of the unresolved bit string to be resolved.

The output of the carry-over approaches referenced above can be bursty and are not feasible for some applications. The unresolved string can also be as long as the whole encoded message, and thus the counter must be long enough to register the length of the whole message. The carry-over control techniques described above can also inadvertently emulate start codes.

Accordingly, a need remains for controlling long carry-over propagation in encoded signals while at the same time preventing emulation of start codes.

SUMMARY OF THE INVENTION

An arithmetic encoder prevents long carry-over propagation and inadvertent start code emulation. The arithmetic encoder converts an input signal into an encoded bit stream that provides a compressed representation of the original input signal. The encoding scheme identifies carry-overs from the encoded signal that propagate into portions of the previously encoded bit stream causing start code emulation. The encoding scheme also detects bit patterns in the encoded bit stream that shifted out of an encoder register emulate a start code. Bits are stuffed into the encoded bit string according to the detected carry-overs and shifted bits that will eventually be output from the encoder. The stuff bits avoid emulation of the start code while at the same time limiting propagation of carry-over bits. Because the same stuff bits are used to both control carry-over propagation and avoid start code emulation, the compression ratio of the arithmetic encoded data is minimally affected.

An arithmetic encoder, according to the invention, includes an encoder unit that encodes the input signal into the encoded bit stream. Several encoder registers are coupled to the encoder unit and store intermediate values of the encoded bit stream. A carry-over register is coupled to both the encoder registers and the encoder unit. The carry-over register receives carry bits from the encoder registers and receives bits shifted from the encoder registers during normalization of the encoded bit stream. Counters are coupled to the encoder unit and function as a guard register for the encoded bits that are output from the encoder unit. The counters in combination with the encoder unit detect output characters that would emulate the start code. The counters track the number of resolved bits and the number of unresolved bits in the encoded bit stream.

A first bit stuffing technique is used for dealing with carry-over bits that are generated during signal encoding. A second bit stuffing technique is used during a normalization stage of the encoding process where encoded bits are shifted out of the encoder register into the carry-over register. During carry-over detection, a first bit value is output after detecting a carry-over bit and counted as a resolved bit. A second bit value is stuffed in the encoded bit stream when the resolved bits would emulate the start code. A number of bits proportional to the number of unresolved bits are then output.

During the normalization stage, a first bit stuffing mode is used when there are no unresolved bits and a second bit stuffing mode is used when there are unresolved bits. The first bit stuffing mode includes outputting bits from the encoded bit stream that have a first bit value, counting each one of the output bits as one of the resolved bits and stuffing a second bit value in the output bits if the resolved bits would emulate the start code. In the second mode, when the number of unresolved bits would emulate the start code, a number of bits proportional to the number of unresolved bits are output followed by a stuff bit. In the second mode, when the number of unresolved bits is less than the number that would emulate the start code but more than zero, all previously unresolved bit are output.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 6 is a table showing bit patterns for unresolved bits that are tracked according to the invention.

DETAILED DESCRIPTION

Background on Arithmetic Codes

Figure 1:
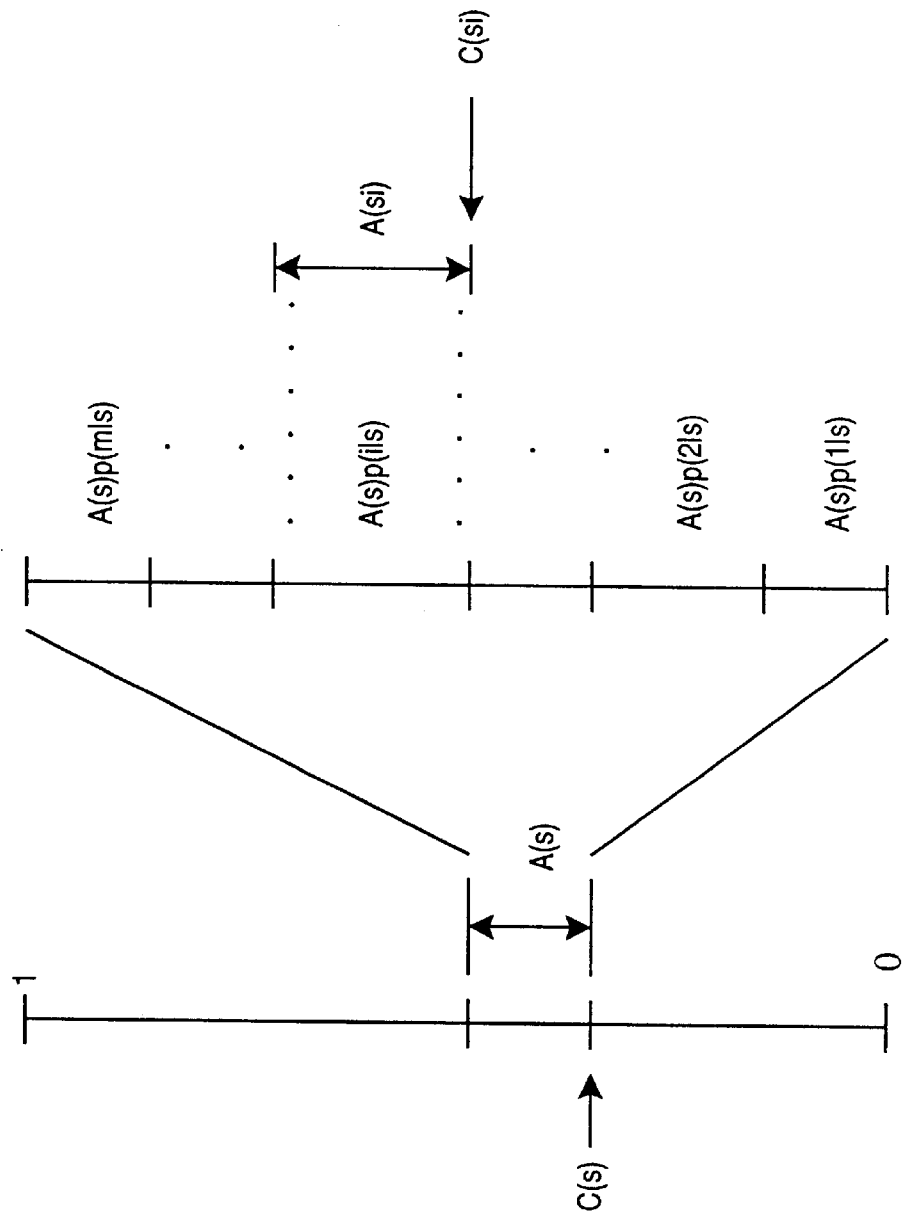
FIG. 1 is a prior art diagram showing the interval structure for an arithmetic coding scheme.

Let an alphabet (A) consist of symbols $i \in \{1,2,\ldots,m\} \equiv A$. The arithmetic coding is initialized by a unit interval $[0,1)$ which is described by its size $A(\Phi)=1$ and a beginning pointer $C(\Phi)=0$, where $\Phi$ denotes a null string. When encoding the symbol i, immediately following the so-far processed string s, the following updates of A(s) and C(s) have to be conducted:

$$A(si)=A(s) \cdot p(i|s), \quad \text{(Equation 1)}$$

$$C(si)=C(s)+A(s) \cdot r(i|s), \quad \text{(Equation 2)}$$

$$\text{where } r(i|s) = \Sigma \frac{i-1}{j=1}$$

p(j|s) and p(i|s), is the conditional probability of symbol i given the previous string s. The updates to A and C are explained by FIG. 1. The current interval, represented by A(s) and C(s), consists of m subintervals, corresponding to m different symbols respectively in A. The size of the subinterval corresponding to symbol i is proportional to its conditional probability p(i|s). The encoding of symbol i is achieved by zooming in the current interval into the subinterval corresponding to i. The resulting C(s) is the code to be transmitted. If infinite-precision storage and computation were available, this coding scheme could achieve its lower bound, the data entropy.

In practice, since a finite number of bits are used to represent A(s) and C(s), two extra operations are required: 1) bit truncation or rounding after multiplications, and 2) normalization of A and C. Multiplication results have to be truncated or rounded to maintain the same number of bits below the binary point. Since this operation will result in a loss of some precision, it has to be done carefully in order to maintain the unique decodability of the arithmetic code.

The second operation, normalization of A and C, is required because A(s) becomes smaller and smaller as encoding proceeds. In order to keep as many significant bits as possible, normalization of A to a value close to 1 is needed. The normalization comprises a left shift and the normalized quantity a(s) can be represented by $a(s)=2^{L(s)}A(s)$, where L(s) is chosen such that a(s) is in a desired range [k,2k). The value of k usually is 0.5 or 1 for easy implementation. The value k=1 is used hereafter without loss of any generality. In order to keep the same scale, the code C(s) is normalized by the same shift, i.e., normalized quantity $c(s)=2^{L(s)}C(s)$. The bits shifted out of register C are ready to be transmitted if there is no further carry-over.

Figure 2:
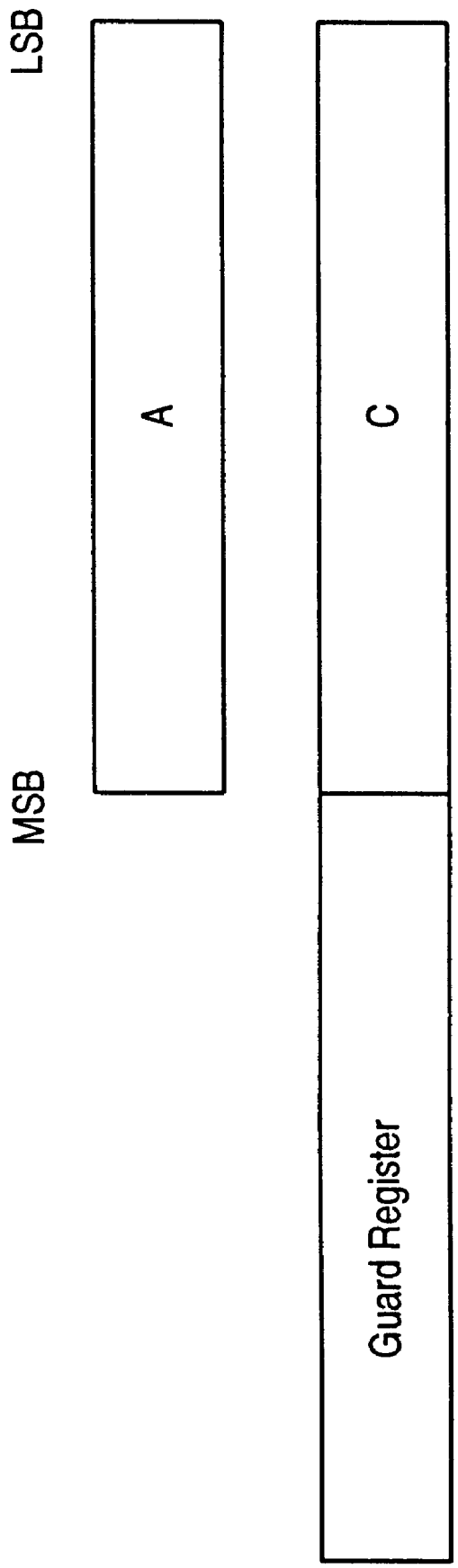
FIG. 2 is a prior art block diagram of registers used for performing arithmetic coding.

Referring to FIG. 2, a guard register accepts those bits shifted out of register C and stores unresolved bits which can still be affected by a carry-over from register C. The unresolved bits always have a pattern of a number ($\geq 0$) of consecutive 1's with a leading 0. Since these unresolved bits have a fixed pattern, a very long guard register can be efficiently implemented by a counter, which records the number of unresolved bits (see FIG. 3).

To be precise in the finite-precision representations, the interval corresponding to s, denoted by interval(s), is represented by the beginning pointer C(s) and the size A(s) as follows:

$$C(s) \leq \text{interval}(s) < C(s)+A(s). \quad \text{(Equation 3)}$$

Arithmetic Codes Without Start Code Emulation and Long Carry-Over Propagation Assuming a start-code is defined as a long string (M) of 1's and followed by a 0. In order to avoid start-code emulation, the code stream generated by an arithmetic encoder has to be restricted to contain at most N+1 consecutive 1's where N<M−1. The smaller N is, the more resilient the code is to errors. The bits shifted out of the C register are checked. If there are N consecutive 1's followed by one or more bits in the guard register, a 0 is inserted after the N -th 1. This 0 not only blocks a potential future carry-over propagation, but also prevents start-code emulation. If there is a carry-over propagating later, this 0 stuff bit is incremented to 1 and becomes the last bit of the maximum number of consecutive 1's. Thus, carry-over propagation is controlled and start-code emulation prevented at the same time.

In a decoder, the encoded bit stream is scanned for N consecutive 1's. The bit right after N consecutive 1's is a stuff bit. If this stuff bit is 0, it is deleted. If the stuff bit is 1, it indicates a carry-over should propagate to the N consecutive 1's. Thus, the normal operations of arithmetic code decoding can be recovered. If the start-code is defined as a long string (M) of 0's and followed by a 1, a bit invertor can be inserted after the arithmetic encoder and also before the arithmetic decoder.

Figure 3:
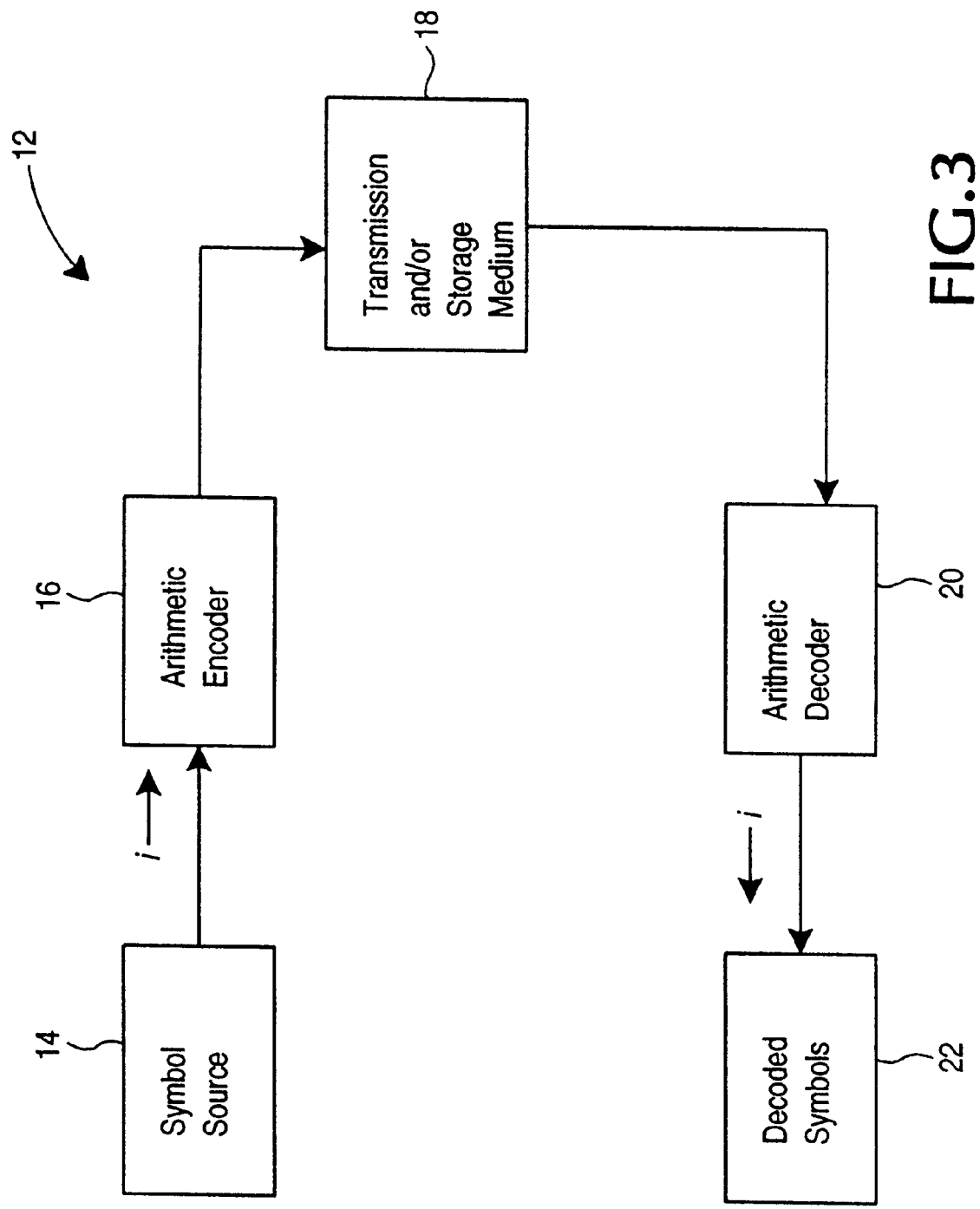
FIG. 3 is a block diagram for an arithmetic encoder system according to the invention.

FIG. 3 shows an arithmetic encoding and decoding system 12 according to the invention. Data symbols i to be encoded are supplied from a symbol source 14 to an arithmetic encoder 16. Symbols i are obtained from any data source and may be, for example, data symbols representing an image. The number of different values A in the alphabet is unrestricted in general, but in many applications the alphabet is binary where A=2. The arithmetic encoder 16 encodes the data symbols in compressed form for transmission as encoded data via transmission and/or storage medium 18. Encoding schemes, other than arithmetic codes, can similarly be used in combination with the invention to control carry-over and start code emulation.

The encoded data from encoder 16 is transmitted via a transmission medium or storage medium 18 to a decoder 20. The decoder 20, in this example, is an arithmetic decoder of a type with is compatible with encoder 16. The decoder 20 decodes the encoded data to obtain a decoded version of the original symbols i supplied from symbol source 14. The decoded symbols i are supplied to decoded symbols unit 22. The decoded symbols unit 22, for example, is a video display unit that displays the decoded symbols as an image.

Figure 4:
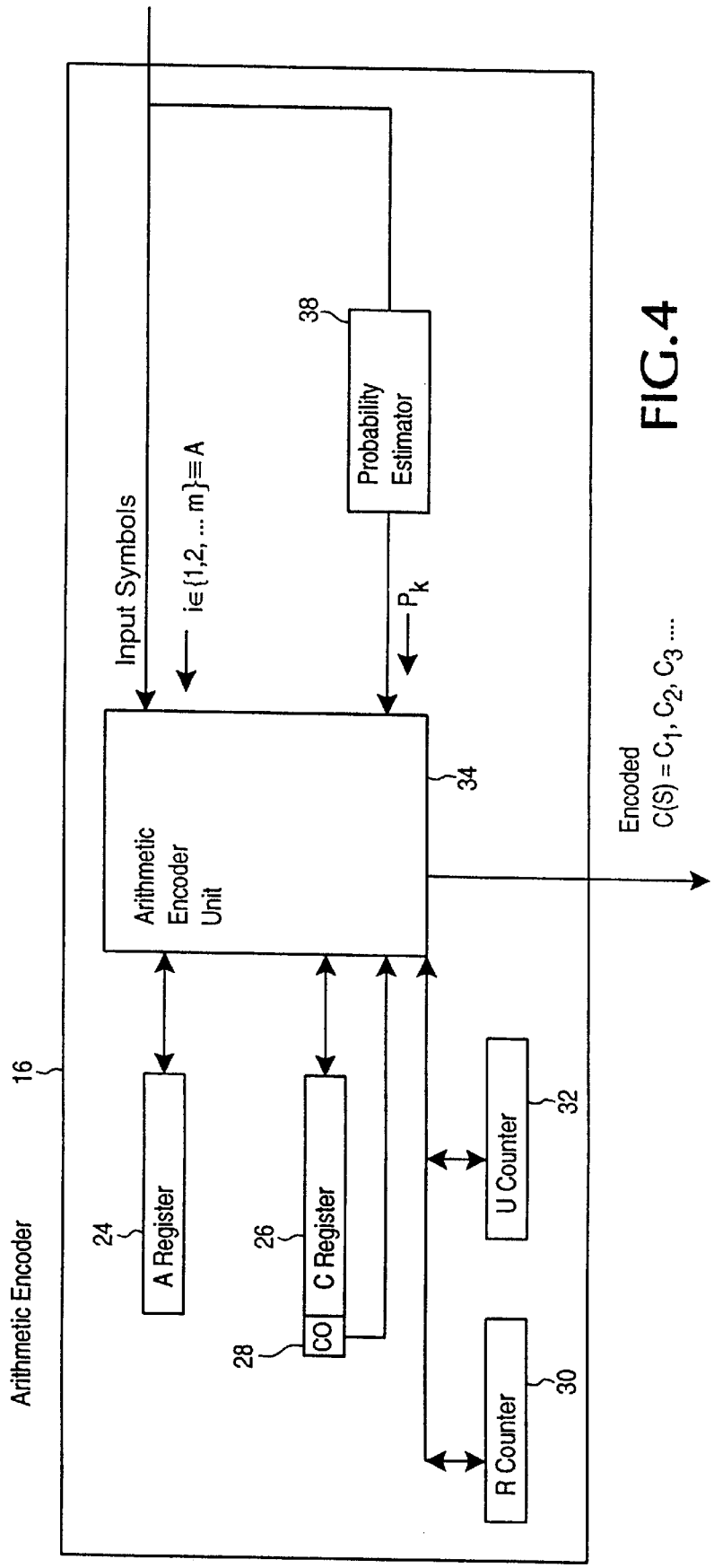
FIG. 4 is a detailed diagram for an arithmetic encoder shown in FIG. 3.

FIG. 4 is a detailed block diagram of the encoder unit 16 shown in FIG. 3. Symbols i, to be encoded, along with a probability estimate p(i|s) for the symbols being encoded, are supplied to an arithmetic encoder unit 34. Arithmetic encoder unit 34 in conjunction with an A register 24, C register 26, carry-over bit register 28, R counter 30 and U counter 32 encode the supplied symbols i in accordance with the invention to yield the desired encoded data.

Probability estimator 38 is responsive to the supplied symbols i to generate desired probability estimates $P_k$. The generated probability estimate $P_k$=p(1|s), p(2 |s), . . . p(i|s), . . . p(m|s). for incoming symbols i. Arithmetic encoder units and probability estimators are known in the art such as described in U.S. Pat. No. 4,463,342 and the IBM Journal article, noted above. Any appropriate probability estimator may be employed in encoder 16. The arithmetic encoder unit 34 comprises a programmable central processing unit. Further details of the arithmetic encoder unit 34, registers 24, 26, 28, and counters 30 and 32 are described below.

Figure 5:
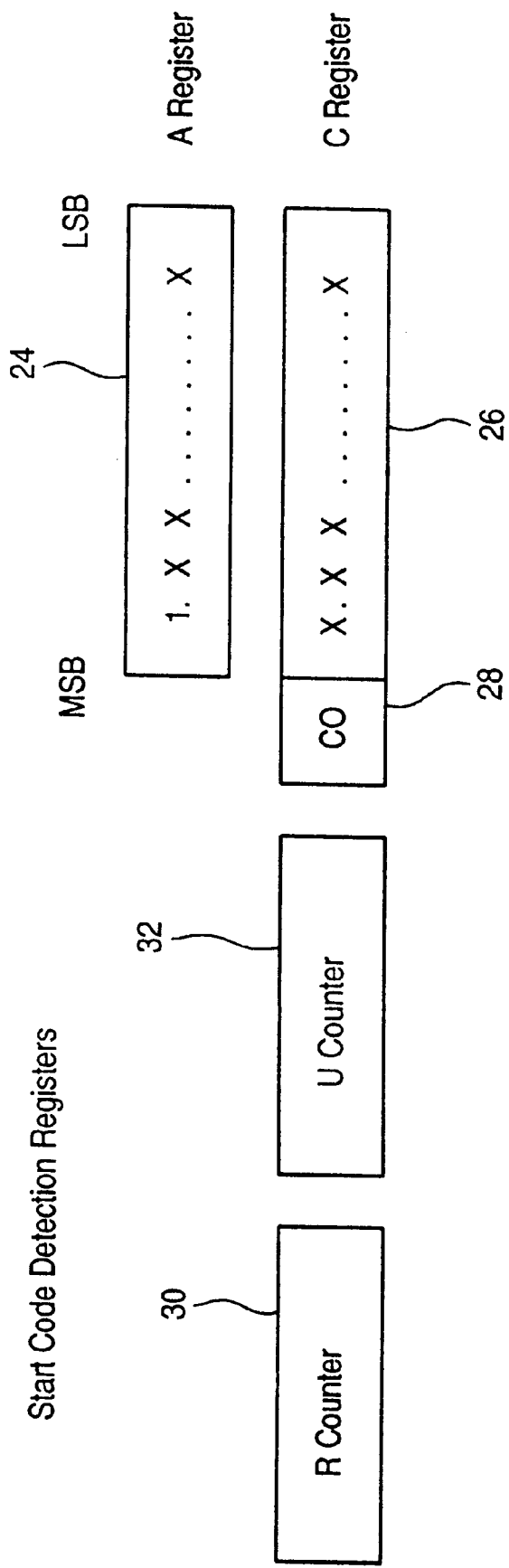
FIG. 5 is a block diagram showing encoder registers used for conducting an encoding scheme according to the invention.

Referring to FIG. 5, the A register 24 and the C register 26 are used for storing intermediate encoded values for the input characters i. The carry-over bit register 28 (C0) is used to store the carry-over from the C register 26 and also the bits shifted out of the C register 26 during the normalization stage. The U counter 32 records the number of unresolved bits shifted out of the C register 26. The relationship between the value in the U counter 32 and the number of unresolved bits is shown in FIG. 6. The R counter 30 records the number of consecutive 1's right before the unresolved bits. The purpose of R counter 30 is to check if the resolved bits has N consecutive 1's.

In one embodiment, the A register 24 is initialized as 1.00 . . . 0 and the C register 26 is initialized as 0.00 . . . 0. The U counter 32 and the R counter 30 are initialized to 0, i.e., U=R=0. Upon encoding each symbol i, the pair of computations described in equations (1) and (2) above are performed. After this pair of computations, the A register 24 is normalized by left shifting bits until the value in the A register 24 is within the range [1,2). The number of bit shifts needed to achieve the normalization is denoted as L. The C register 26 requires the same number of left shifts.

Figure 7:
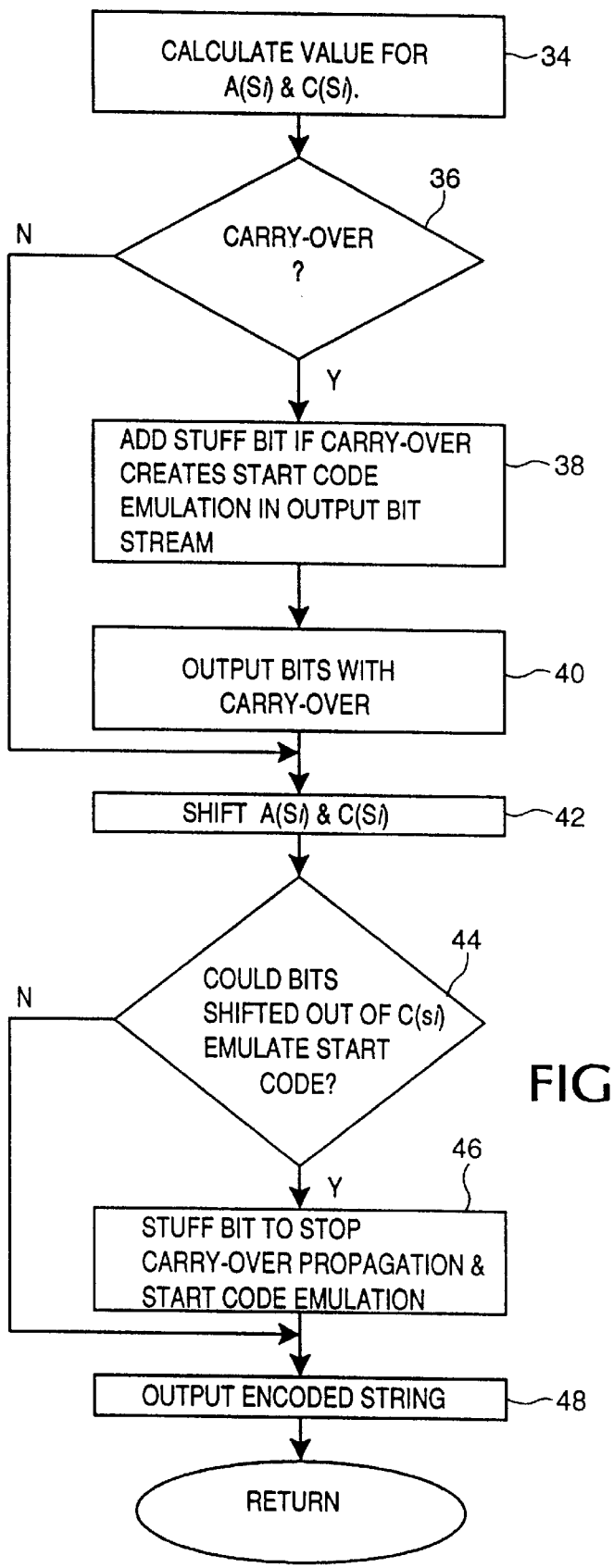
FIG. 7 is a step diagram showing the multiple operating stages for the arithmetic encoder in FIG. 4.

Referring to FIGS. 5 and 7, two procedures follow the derivation of an encoded value in the C register 26. The first procedure deals with carry-over from the C register 26. The second procedure deals with the left shift of the C register 26 by L bits during normalization. The values for the current interval value A(si) and the current interval pointer C(si) are calculated in step 34. The carry-over register 28 is checked for carry-over in decision step 36. If a carry-over is detected, step 38 adds stuff bits if the carry-over bit would cause the preceding bits to emulate a start code (e.g., "111111110"). The encoded bits with the inserted stuff bit are output to the transmission medium 18 (FIG. 3) in step 40.

If no carry-over is detected in step 36, a second procedure is performed during the encoding normalization stage. The current interval value A(si) and the current interval pointer C(si) are left shifted in step 42. Bits are shifted out one by one of the C register 26 and into the C0 register 28 are detected in decision step 44. If the preceding bits shifted out of the C register 26 and the current bit in the C0 register 28 emulate the start code, step 46 inserts a stuff bit into the encoded character string. The stuff bit stops further carry-over propagation and also prevents the encoded characters output from the encoder from emulating the start code. The encoded character string is then output to the transmission or storage medium 18 (FIG. 18) in step 48. If the bits shifted out of the C register 26 do not emulate the start code, decision step 44 outputs the encoded characters in step 48.

Figure 8:
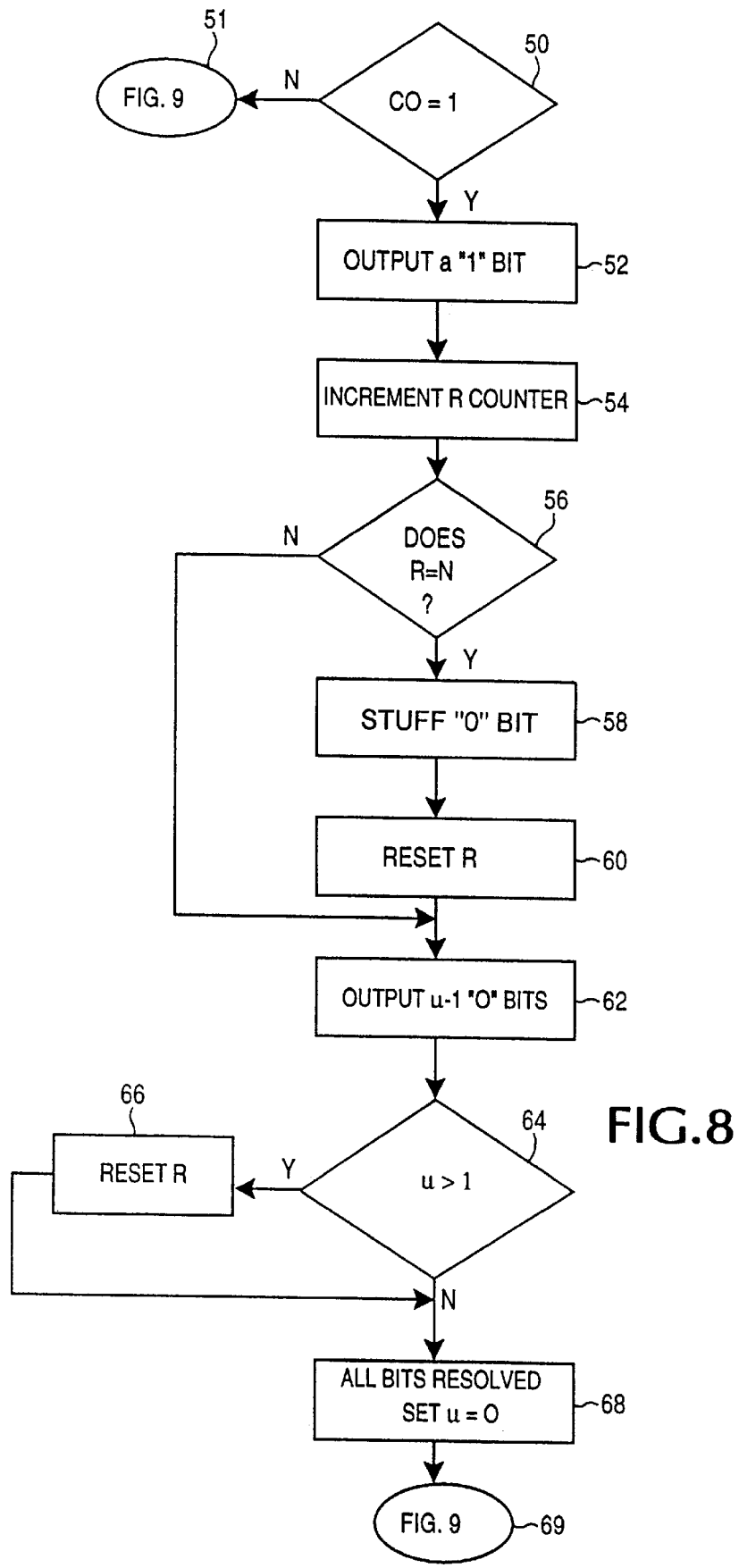
FIG. 8 is a step diagram showing a carry-over bit detection stage of the invention.
Figure 9:
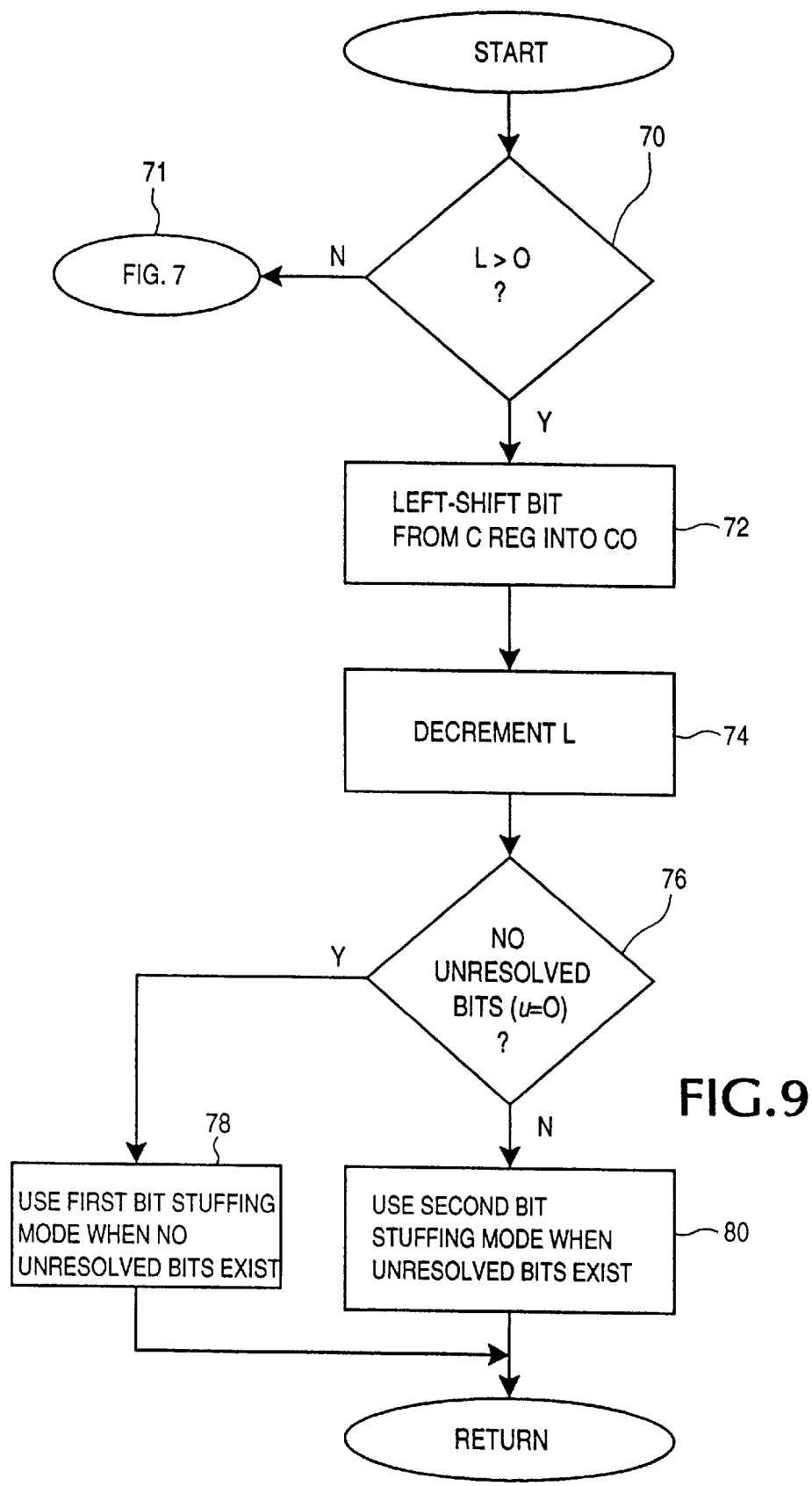
FIG. 9 is a step diagram showing a normalization bit shift detection stage of the invention.

Referring to FIG. 8, decision step 50 determines whether a carry-over is indicated by C0 register 28 (FIG. 5). If C0=0, there is no carry-over and the second normalization procedure shown in FIG. 9 is initiated in step 51. If C0=0, there is a carry-over. There is at least one unresolved bit if there is a carry-over in arithmetic coding. The leading "0" bit will become "1" and become resolved. Step 52 outputs the "1" bit. This new "1" bit concatenates with the resolved 1's right before it incrementing the R counter in step 54.

Decision step 56 determines whether the number of resolved bits reaches the length of N. The value N is at least two less than the number of 1 bits required to emulate the start code. If the value in the R counter 30 is equal to N, a zero bit is stuffed after the new "1" bit in step 58. The inserted "0" bit will not become "1" because the unresolved bits can only be affected by a carry-over once. The inserted "0" bit is then viewed as a resolved bit. Thus, this inserted "0" bit guarantee the length of the preceding consecutive 1's will not increase further and remain as N, avoiding start-code emulation.

The R counter is reset to 0 in step 60. The unresolved bits are toggled by the carry-over bit in step 62 and become resolved. If there is more than one unresolved bit indicated by decision step 64, R counter 30 is reset in step 66. If there is one or less unresolved bits, the U counter 32 is reset to 0 in step 68 after all the newly resolved bits have been output. The second normalization procedure in FIG. 9 is then initiated in step 69.

Procedure For Shifting the C Register

Referring to FIG. 9, decision step 70 determines if the normalization procedure is completed by determining whether the C register 26 has been shifted by the number of bits indicated by the left shift value L. If all L bits have been shifted left out of the C register, step 71 jumps back to the operation shown in FIG. 7, to derive the values of A(si) and C(si) for the next input character. Step 72 performs a left shift operation on the C register 26. The bit shifted out of the C register 26 is shifted into the C0 register 28. The shift variable L is decremented in step 74.

There are two major modes of operation after the bits have been shifted from the C register 26 into the C0 register 28. The mode used depends upon whether there are any unresolved bits. Decision step 76 determines whether there are any unresolved bits in the U counter 32. A first bit stuffing mode is used in step 78 when there are no unresolved bits (i.e., U=0) in the U counter. A second bit stuffing mode is used in step 80 when there is at least one unresolved bit (i.e., U>0) in the U counter.

Figure 10:
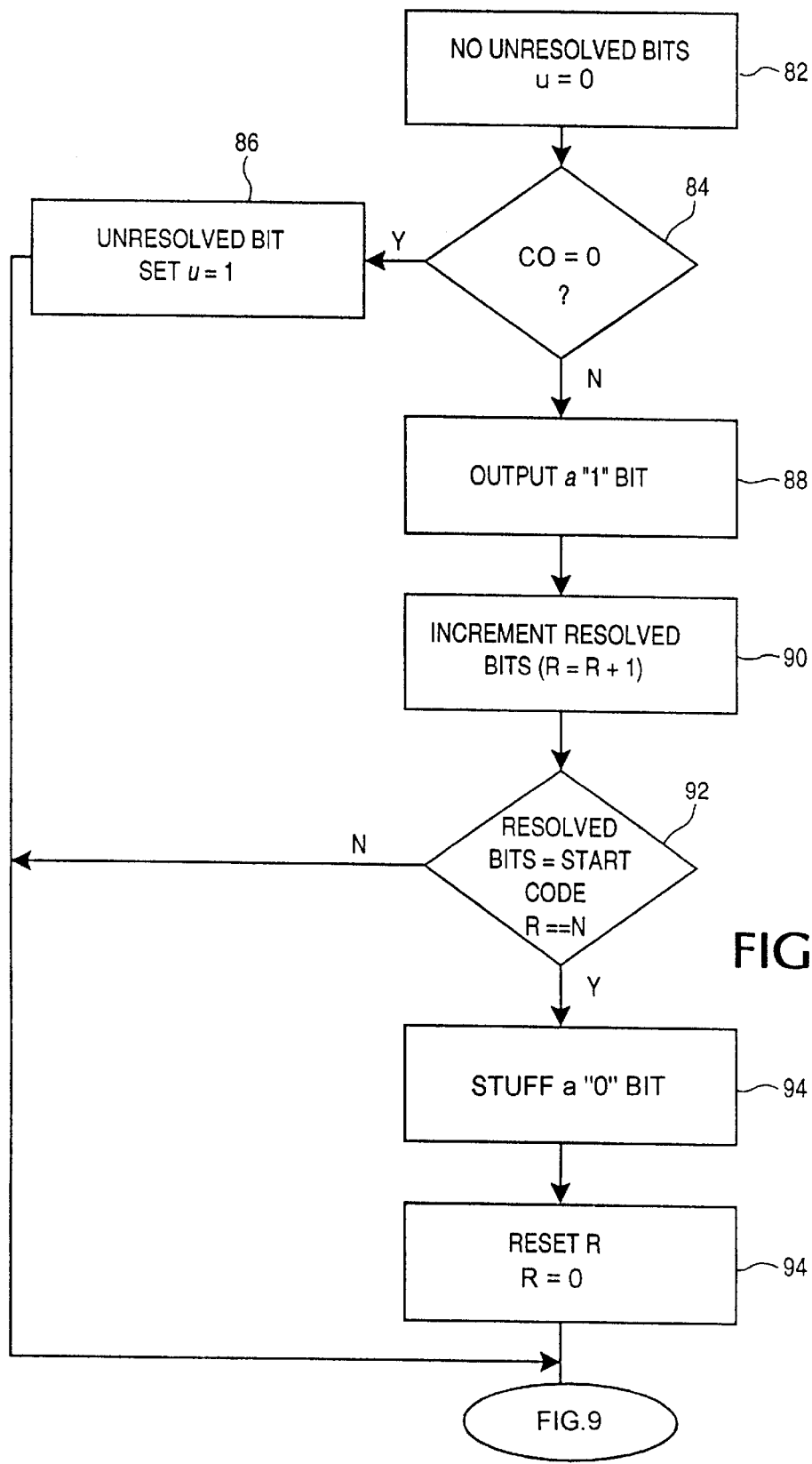
FIG. 10 is a step diagram showing a first bit stuffing mode performed during the normalization stage in FIG. 9.

Referring to FIG. 10, step 82 starts the first bit stuffing mode when there are no unresolved bits. Decision step 84 checks the logic state of the carry-over register 28. A "0" bit in the C0 register constitutes an unresolved bit, and the U counter is set to 1 in step 86. The first bit stuffing mode then returns, if necessary, to check the next bit shifted into the C0 register.

A "1" bit in the C0 register is a resolved bit because there is no unresolved "0" bit to catch any carry-over propagation. Accordingly, a 1 bit is output in step 88 and the number of resolved bits incremented by 1 in step 90. If C0=1, decision step 92 checks whether the output "1" bit would concatenate with resolved 1's right before it to form N consecutive 1's. If R≠N, The first bit stuffing mode then returns to FIG. 9 and checks the next bit shifted into the C0 register.

If R==N, a zero bit is stuffed into the encoded output string in step 94. The inserted "0" bit is already resolved, i.e., it will remain "0", and make the length of the preceding consecutive 1's remain at N. Thus, the "0" bit avoids start-code emulation. The number of resolved bits is then reset in step 94.

Figure 11:
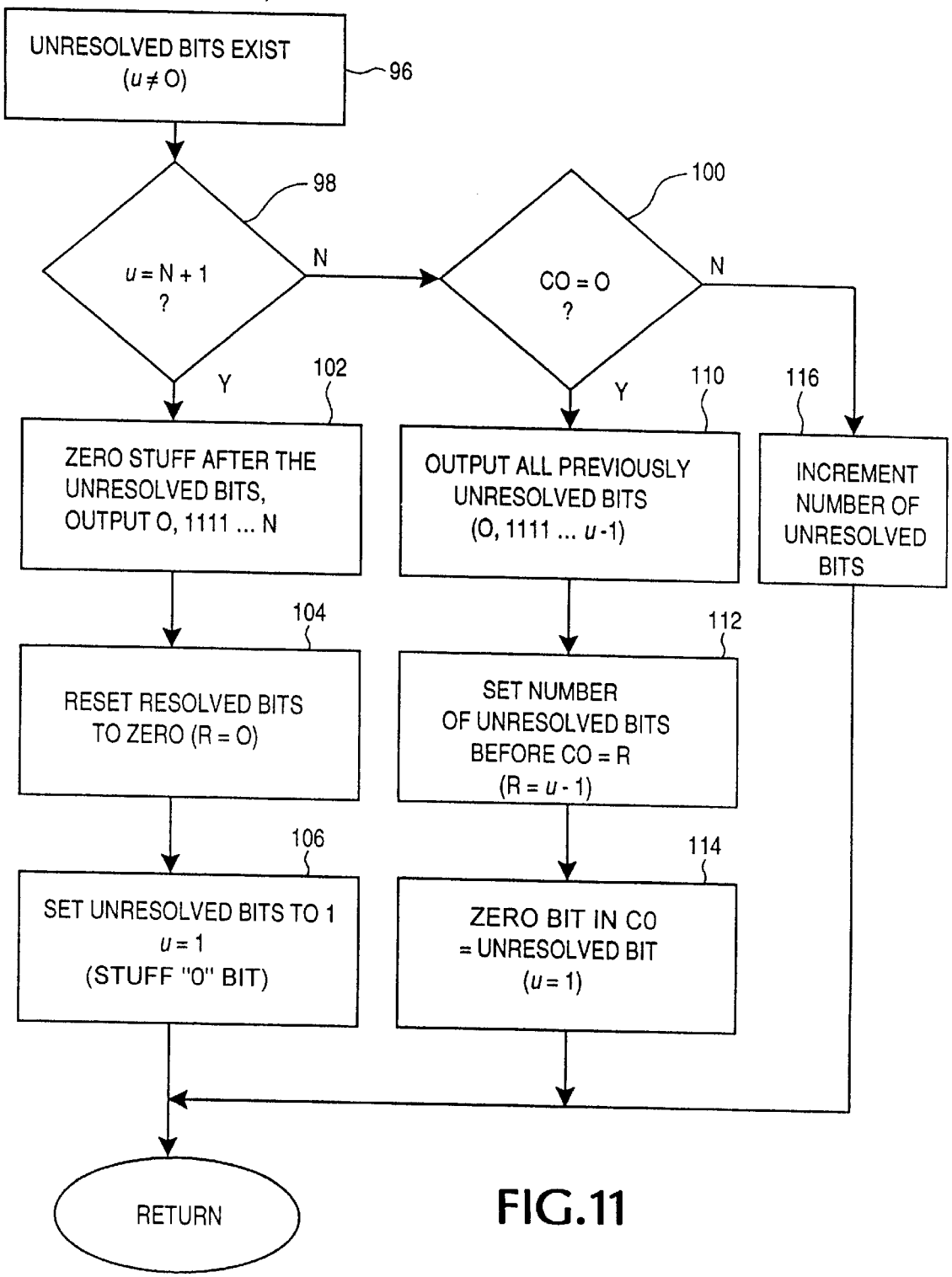
FIG. 11 is a step diagram showing a second bit stuffing mode performed during the normalization stage in FIG. 9.

Referring to FIG. 11, if there is at least one unresolved bit during the normalization shifting of the C register 26 (FIG. 5), step 96 initiates the second bit stuffing mode. Decision step 98 checks whether the previously unresolved bits in the U counter 32 have a consecutive 1 length of N. The checking is done by checking whether U=N+1, a leading 0 followed by N 1's. If U=N+1, these previous unresolved bits are output in step 102, the R counter is reset in step 104 and a zero bit inserted in step 106, right after the unresolved bits are output. A Zero bit is inserted by setting the U counter 32 to 1.

Note, the inserted zero bit is before the bit in the C0 register. It is critical to have at least one bit (which is shifted from out of the C register) following the inserted zero bit to avoid start-code emulation. If there is no bit which is already output from the C register, the inserted "0" bit may be toggled to "1" by a carry-over and the long consecutive 1's could keep on growing longer on subsequently encoded input characters. Thus, start-code emulation could occur. With a bit in C0 following the inserted "0" bit, the two bits will become either "01" (if C0=0) or "10" (if C0=1) if there is a carry-over later. There is at least one "0" bit within these two bits in either case, whether there is a carry-over or not. In the worst case ("10"), the length of consecutive 1's would be increased only by one. Thus, using this scheme, it is guaranteed that the maximum number of consecutive 1's is N+1.

For a number of unresolved bits (N+1)>U>0, decision step 100 checks C0. If C0=0, the bit in C0 will stop a possible carry-over propagation to the previously unresolved bits. Thus, bits before C0 become resolved and are output in step 110. The length of resolved 1 bits right before the only unresolved bit in C0 is set to R=U−1 in step 112. The number of unresolved bits is set to 1 in step 114. If C0=1 in decision step 100, the number of unresolved bits is increased by one in step 116.

Source code that implements the procedure shown in FIG. 8 is shown in Appendix A. The source code that implements the procedure shown in FIGS. 9–11 is shown in Appendix B. The source code is operated in the arithmetic encoder unit 34 shown in FIG. 4.

Thus, long carry-over propagation are start code emulation are both avoided at the same time by stuffing bits into the encode character string. Because the same stuff bit both controls carry-over propagation and state code emulation, the number of required stuff bits is reduced which, in turn, minimizes the negative effect that bit stuffing has on the compression ratio of the arithmetic encoder.

Having described and illustrated the principles of the invention in a preferred embodiment thereof, it should be apparent that the invention can be modified in arrangement and detail without departing from such principles. I claim all modifications and variation coming within the spirit and scope of the following claims.

APPENDIX A

The procedure to Deal with Carry-Over
A function, outbits (b,n), represents an output operation of n bits of b, where b = 0 or 1.

```
1    if ( C0 == 1 ) {          % Carry-Over is indicated by C0 = 1.
2        outbits (1, 1);        % Output a "1" bit.
3        R = R + 1;             % Increment the R counter.
4        if ( R == N ) {        % If the resolved bits form N consecutive 1's, ...
5            outbits (0, 1);    % Stuff a "0" bit.
6            R = 0;             % Reset R.
7        }
```

APPENDIX A-continued

The procedure to Deal with Carry-Over
A function, outbits (b,n), represents an output operation of n bits of b, where b = 0 or 1.

```
8        outbits (0, U − 1);    % Output (U − 1) "0" bits.
9        if ( U > 1 ) R = 0;    % If there are any "0" output bits, R = 0.
10       U = 0;                 % All the bits are resolved.
11   }
```

APPENDIX B

The Procedure to Shift the C Register

```
1    while ( L > 0 ) {            % Loops L times.
2        left_shift (C);           % Left shift a bit of the C register into C0.
3        L = L − 1;                % Decrement L.
4        if ( U == 0 ) {           % If there is no unresolved bits, ...
5            if ( C0 == 0 ) {      % If the C0 bit is 0, it is an unresolved bit.
6                U = 1;            % The number of unresolved bits equals to 1.
7            } else {              % If the C0 bit is 1, it is an resolved bit.
8                outbits (1, 1,);  % Output a "1" bit.
9                R = R + 1;        % Increment R.
10               if ( R == N ) {   % If the resolved bits form N 1's, ...
11                   outbits (0, 1); % Stuff a "0" bit.
12                   R = 0 ;       % Reset R.
13               }
14           }
15       } else {                  % If there are unresolved bits,
16           if ( U == (N + 1) ) { % If previously unresolved bits reach N + 1, ...
17               outbits (0, 1);   % Zero stuffing after these unresolved bits
18               outbits (1, N);   % and these unresolved bits become resolved.
19               R = 0;            % Reset R.
20               U = 1;            % Stuff a "0" bit.
21           }
22           if ( C0 == 0 ) {      % If C0 = 0, all unresolved bits are resolved.
23               outbits (0, 1);   % Output the preyiously unresolved bits.
24               outbits (1, U − 1); % Same as above.
25               R = U − 1;        % The length of 1's before C0 is U − 1.
26               U = 1;            % The "0" bit in C0 is the only unresolved bit.
27           } else {              % If C0 = 1, there is one more unresolved bit.
28               U = U + 1;        % Increment U. R remains the same.
29           }
30       }
31   }
```

I claim:

1. A method for encoding an input signal, comprising:
    encoding the input signal into an encoded bit stream;
    identifying carry-over bits generated from the encoded input signal that propagate into portions of the encoded bit stream;
    detecting a bit pattern in the encoded bit stream that could emulate a start code; and
    stuffing bits in the encoded bit stream that avoid emulation of the start code while at the same time controlling propagation of the carry-over bits in the encoded bit stream.

2. A method according to claim 1 wherein the step of encoding comprises arithmetic encoding the input signal in response to a probability estimate, the arithmetic encoded bit stream being a compressed version of the input signal.

3. A method according to claim 1 wherein detecting the start code comprises tracking a number of resolved bits not effected by the carry-over bits and tracking a number of unresolved bits that are effected by the carry-over bits.

4. A method according to claim 3 wherein identifying carry-over bits includes the following steps:

outputting a first bit value after detecting one of the carry-over bits;

counting the output first bit value as one of the resolved bits;

stuffing a second bit value in the encoded bit stream after the first bit value when the resolved bits could emulate the start code; and outputting a number of the second bit values according to the number of unresolved bits.

5. A method according to claim 3 including the following steps:

using a first bit stuffing mode when there are no unresolved bits; and using a second bit stuffing mode when there are unresolved bits.

6. A method according to claim 5 wherein the first bit stuffing mode includes the following steps;

outputting bits from the encoded bit stream that have a first bit value;

counting each one of the output bits as one of the resolved bits; and stuffing a second bit value in the output bits when the resolved bits would emulate the start code.

7. A method according to claim 5 wherein the second bit stuffing mode includes the following steps;

outputting a predetermined number of bits having a first bit value when the number of unresolved bits could emulate the start code; and stuffing a bit having a second bit value after the bits having the first bit value.

8. A method according to claim 7 including the following steps;

outputting all the unresolved bits when a leading bit in the encoded bit stream has the first bit value;

setting the unresolved bits to resolved bits;

counting the leading bit as an the unresolved bit; and incrementing the number of unresolved bits when the leading bit has the second bit value.

9. A method according to claim 3 wherein tracking the number of unresolved bits comprises detecting a predetermined pattern in the encoded bit stream including a first bit with a first bit value followed by one or more subsequent bits each with a second bit value, the number of unresolved bits proportional to the number of subsequent bits having the second bit value.

10. A method for encoding an input signal, comprising:

arithmetic encoding the input signal into an encoded bit stream;

conducting a first carry-over detection phase for identifying carry-over bits generated from the encoded input signal, the first carry-over detection phase detecting carry-over bits that in combination with preceding portions of the encoded bit stream emulate a start code;

conducting a second normalize detection phase for identifying shifted output bits of the encoded input signal, the second normalize detection phase detecting shifted bits that in combination with preceding portions of the encoded bit stream emulate the start code; and stuffing bits into the encoded bit stream when one of the first and second detection phase identify emulation of the start code, the bit stuffing avoiding emulation of the start code while at the same time limiting propagation of carry-over bits in the encoded bit stream.

11. A method according to claim 10 including the following steps:

transmitting the encoded bit stream over a transmission medium;

scanning the transmitted encoded bit stream for a predetermined bit pattern and a following stuff bit;

dropping the stuff bit having a first bit value; and propagating the stuff bit as a carry-over to the predetermined bit pattern when the stuff bit has a second bit value.

12. A method according to claim 10 wherein the step of arithmetic coding the input signal comprises the following steps:

calculating an interval value A(si) and an interval pointer C(si);

storing bits representing the interval value A(si) in a first register and storing bits representing the interval pointer C(si) in a second register, the second register including a carry-bit register;

normalizing A(si) by shifting a number of bits out of the first register;

normalizing C(si) by shifting the same number of bits out of the second register through the carry-bit register, the bits shifted out of the carry bit register comprising the encoded bit stream.

13. A method according to claim 12 wherein stuffing bits comprises the following steps:

tracking a number of resolved bits not effected by the carry-over bits;

tracking a number of unresolved bits that are effected by the carry-over bits, the resolved and unresolved bits varying according to bit values in the carry-over register from carry-over and from normalization in the second register; and stuffing bits in the encoded bit stream according to the number of resolved bits, unresolved bits and carry-over bits.

14. A method according to claim 13 wherein the second normalize detection phase comprises conducting a first bit stuffing mode when there are unresolved bits and conducting a second bits stuffing mode when there are not unresolved bits.

15. A circuit for encoding a character stream, comprising:

an encoder unit encoding the character stream into an encoded bit stream;

an encoder register coupled to the encoder unit for storing intermediate values of the encoded bit stream;

a carry-bit register coupled to both the encoder register and the encoder unit, the carry-bit register receiving carry bits from the encoder register and receiving bits shifted from the encoder register during normalization of the encoded bit stream; and a counter circuit coupled to the encoder unit for detecting emulation of a start code in the encoded bit stream, the encoder unit stuffing bits in the encoded bit stream that avoid emulation of the start code while at the same time limiting propagation of carry-over bits in the encoded bit stream.

16. A circuit according to claim 15 wherein the encoder register stores an arithmetic encoding interval pointer C(si).

17. A circuit according to claim 15 wherein the counter circuit tracks a number of resolved bits in the encoded bit stream not effected by the carry bits and a number of unresolved bits that are effected by the carry bits.

18. A circuit according to claim 15 wherein the counter circuit includes a first resolved bit counter and a second unresolved bit counter.

19. A circuit according to claim 15 including the following:

a decoder for decoding the encoded bit stream; and a transmission medium for transmitting the encoded bit stream from the encoder to the decoder.

* * * * *

UNITED STATES PATENT AND TRADEMARK OFFICE
CERTIFICATE OF CORRECTION

PATENT NO.   : 5,955,977
DATED        : Sept. 21, 1999
INVENTOR(S)  : Shaw-Min Lei It is certified that error appears in the above-identified patent and that said Letters Patent is hereby corrected as shown below:

Column 3, line 20, "A(Φ) = 1" should read -- A(∅) = 1 --;
Column 3, line 21, "C(Φ) = 0, where Φ denotes" should read -- C(∅) = 0, where ∅ denotes --.

Signed and Sealed this

Sixteenth Day of May, 2000

Attest:

Q. TODD DICKINSON

*Attesting Officer*          *Director of Patents and Trademarks*